(12) United States Patent
Woo et al.

(10) Patent No.: US 11,799,491 B1
(45) Date of Patent: Oct. 24, 2023

(54) BOOTSTRAP CIRCUIT WITH BOOSTED IMPEDANCE

(71) Applicant: Apple Inc., Cupertino, CA (US)

(72) Inventors: Sang Hyun Woo, Austin, TX (US); Florian Mrugalla, Munich (DE)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/835,594

(22) Filed: Jun. 8, 2022

(51) Int. Cl.
    *H03M 1/12* (2006.01)

(52) U.S. Cl.
    CPC .................................. *H03M 1/124* (2013.01)

(58) Field of Classification Search
    CPC ........................................... H03M 1/124
    USPC ............................................. 341/155
    See application file for complete search history.

(56) References Cited

U.S. PATENT DOCUMENTS

| | | | |
|---|---|---|---|
| 6,072,355 A | 6/2000 | Bledsoe | |
| 8,248,329 B2 | 8/2012 | Yamamoto et al. | |
| 8,350,738 B2 | 1/2013 | Sanduleanu et al. | |
| 9,559,713 B1* | 1/2017 | Wu | H03M 1/1038 |
| 9,722,609 B2 | 8/2017 | Kinzer et al. | |
| 9,842,551 B2 | 12/2017 | Yamashita et al. | |
| 9,893,738 B2 | 2/2018 | Lee et al. | |
| 10,879,805 B2 | 12/2020 | Notsch | |
| 11,005,453 B2 | 5/2021 | Chern et al. | |
| 2019/0280705 A1* | 9/2019 | Bodnar | H03M 1/145 |
| 2021/0272507 A1 | 9/2021 | Hirose et al. | |
| 2021/0391795 A1 | 12/2021 | Gandhi et al. | |

OTHER PUBLICATIONS

Behzad Razavi, The Design of a Bootstrapped Sampling Circuit, IEEE Solid-State Circuits Magazine, Jan. 2021, pp. 7-12, vol. 13, Issue 1, IEEE, New York, New York, United States.

\* cited by examiner

*Primary Examiner* — Jean B Jeanglaude
(74) *Attorney, Agent, or Firm* — TREYZ LAW GROUP; Jason Tsai

(57) ABSTRACT

An electronic device may include wireless circuitry having analog-to-digital converter (ADC) circuitry. The ADC circuitry may include a sampling switch coupled to a bootstrap circuit. The bootstrap circuit may include a bootstrap capacitor, a first transistor coupled between an input of the sampling switch and a bottom plate terminal of the bootstrap capacitor, a second transistor coupled between the bottom plate terminal of the bootstrap capacitor and ground, and a resistor or transistor that is disposed between the first transistor and the bottom plate terminal of the bootstrap capacitor and that is configured to boost the input impedance of the bootstrap circuit.

20 Claims, 9 Drawing Sheets

BOOTSTRAP CIRCUIT WITH BOOSTED IMPEDANCE

FIELD

This disclosure relates generally to electronic devices and, more particularly, to electronic devices with wireless communications circuitry.

BACKGROUND

Electronic devices can be provided with wireless communications capabilities. An electronic device with wireless communications capabilities has wireless communications circuitry with one or more antennas. Wireless receiver circuitry in the wireless communications circuitry uses the antennas to receive and transmit radio-frequency signals.

Signals received by the antennas are fed through a transceiver, which can include an analog-to-digital converter and an input sampling switch at an input of the analog-to-digital converter. The input sampling switch can have a bootstrap circuit for maintaining a constant gate-to-source voltage across the input sampling switch. It can be challenging to design a satisfactory bootstrap circuit. If care is not taken, the DC voltage level and signal gain at the input sampling switch can be degraded.

SUMMARY

A bootstrap circuit is provided. The bootstrap circuit can be coupled to a sampling switch. The bootstrap circuit may be coupled across an input terminal and a control terminal of the sampling switch to help maintain a constant voltage across the input and control terminals of the sampling switch. The sampling switch may be a sampling switch at the input of an analog-to-digital converter within wireless circuitry. The sampling switch can be considered as part of the analog-to-digital converter. The bootstrap circuitry may include a bootstrap capacitor, a first transistor coupled between the input terminal of the sampling switch and a bottom plate terminal of the bootstrap capacitor, a second transistor coupled between the bottom plate terminal of the bootstrap capacitor and a ground line, and a resistive element coupled between the first transistor and the bottom plate terminal of the bootstrap capacitor. The resistive element may be a resistor or a transistor that is configured to boost the input resistance of the bootstrap circuit. Configured and operated in this way, the performance of the sampling switch and the overall analog-to-digital converter can be optimized.

An aspect of the disclosure provides a bootstrap circuit that includes a bootstrap capacitor; a first transistor having a first source-drain terminal coupled to an input port of the bootstrap circuit, a gate terminal coupled to an output port of the bootstrap circuit, and a second source-drain terminal coupled to a terminal of the bootstrap capacitor; a second transistor having a first source-drain terminal coupled to the terminal of the bootstrap capacitor and having a second source-drain terminal coupled to a ground power supply line; and a resistive component coupled between the second source-drain terminal of the first transistor and the terminal of the bootstrap capacitor. The resistive component can be a transistor having a first source-drain terminal coupled to the second source-drain terminal of the first transistor, a second source-drain terminal coupled to the terminal of the bootstrap capacitor, and a gate terminal coupled to the gate terminal of the first transistor. The resistive component can be turned on during a first phase of operation and can be turned off during a second phase of operation, the bootstrap circuit alternating between the first and second phases of operation. The resistive component can be a resistor having a first terminal coupled to the second source-drain terminal of the first transistor and having a second terminal coupled to the terminal of the bootstrap capacitor.

An aspect of the disclosure comprises circuitry that includes a sampling switch configured to receive an input voltage; a capacitor; a first transistor having a first source-drain terminal configured to receive the input voltage, a gate terminal coupled to a control terminal of the sampling switch, and a second source-drain terminal coupled to a terminal of the capacitor; a second transistor having a first source-drain terminal coupled to the terminal of the capacitor and having a second source-drain terminal coupled to ground; and a resistive component coupled between the second source-drain terminal of the first transistor and the terminal of the capacitor. The resistive component can be a transistor having a first source-drain terminal coupled to the second source-drain terminal of the first transistor, a second source-drain terminal coupled to the terminal of the capacitor, and a gate terminal coupled to the control terminal of the sampling switch. The second transistor can have a gate terminal configured to receive a clock signal. The second transistor can be configured to discharge the terminal of the capacitor when the clock signal is asserted, and the resistive component can be turned off while the second transistor is used to discharge the terminal of the capacitor. The resistive component can be a resistor having a first terminal coupled to the second source-drain terminal of the first transistor and having a second terminal coupled to the terminal of the capacitor.

An aspect of the disclosure comprises analog-to-digital converter (ADC) circuitry that includes a sampling switch having an input configured to receive an input voltage, an output coupled to other portions of the analog-to-digital converter circuitry, and a control terminal; and a bootstrap circuit. The bootstrap circuit can include a capacitor; a first transistor having a first source-drain terminal coupled to the input of the sampling switch, a gate terminal coupled to the control terminal of the sampling switch, and a second source-drain terminal coupled to a terminal of the capacitor; and a resistive component coupled between the second source-drain terminal of the first transistor and the terminal of the capacitor. The wireless circuitry can further include a baseband filter coupled to the sampling switch. The bootstrap circuit can include a second transistor having a first source-drain terminal coupled to the terminal of the capacitor, a second source-drain terminal coupled to a power supply line, and a gate terminal configured to receive a clock signal. The resistive component can be a resistor or a transistor configured to increase the input resistance of the bootstrap circuit.

DETAILED DESCRIPTION

Figure 1:
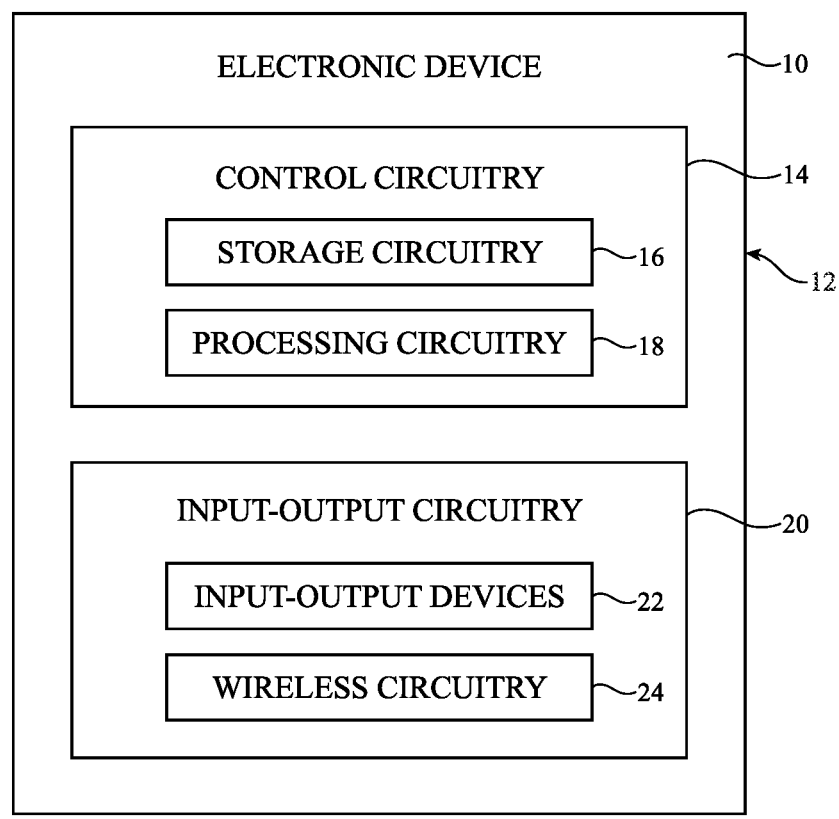
FIG. 1 is a diagram of an illustrative electronic device having wireless circuitry in accordance with some embodiments.

An electronic device such as electronic device 10 of FIG. 1 may be provided with a sampling switch and a bootstrap circuit coupled to the sampling switch. The bootstrap circuit may be configured to maintain a constant voltage across gate and source terminals of the sampling switch. The bootstrap circuit may include a bootstrap capacitor, a first transistor coupled between an input port of the bootstrap circuit and a terminal of the bootstrap capacitor, a second transistor coupled between the terminal of the bootstrap capacitor and a ground line, and other control transistors. An additional resistor or transistor can be coupled in series between the first transistor and the terminal of the bootstrap capacitor to boost the input impedance of the bootstrap circuit. Increasing the input impedance of the bootstrap circuit in this way can help maintain or restore a higher DC voltage level at the sampling switch. Such bootstrap circuit can be included in any type of electronic device 10.

Electronic device 10 of FIG. 1 may be a computing device such as a laptop computer, a desktop computer, a computer monitor containing an embedded computer, a tablet computer, a cellular telephone, a media player, or other handheld or portable electronic device, a smaller device such as a wristwatch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, a wireless internet-connected voice-controlled speaker, a home entertainment device, a remote control device, a gaming controller, a peripheral user input device, a wireless base station or access point, equipment that implements the functionality of two or more of these devices, or other electronic equipment.

As shown in the functional block diagram of FIG. 1, device 10 may include components located on or within an electronic device housing such as housing 12. Housing 12, which may sometimes be referred to as a case, may be formed from plastic, glass, ceramics, fiber composites, metal (e.g., stainless steel, aluminum, metal alloys, etc.), other suitable materials, or a combination of these materials. In some embodiments, parts or all of housing 12 may be formed from dielectric or other low-conductivity material (e.g., glass, ceramic, plastic, sapphire, etc.). In other embodiments, housing 12 or at least some of the structures that make up housing 12 may be formed from metal elements.

Device 10 may include control circuitry 14. Control circuitry 14 may include storage such as storage circuitry 16. Storage circuitry 16 may include hard disk drive storage, nonvolatile memory (e.g., flash memory or other electrically-programmable-read-only memory configured to form a solid-state drive), volatile memory (e.g., static or dynamic random-access-memory), etc. Storage circuitry 16 may include storage that is integrated within device 10 and/or removable storage media.

Control circuitry 14 may include processing circuitry such as processing circuitry 18. Processing circuitry 18 may be used to control the operation of device 10. Processing circuitry 18 may include on one or more microprocessors, microcontrollers, digital signal processors, host processors, baseband processor integrated circuits, application specific integrated circuits, central processing units (CPUs), etc. Control circuitry 14 may be configured to perform operations in device 10 using hardware (e.g., dedicated hardware or circuitry), firmware, and/or software. Software code for performing operations in device 10 may be stored on storage circuitry 16 (e.g., storage circuitry 16 may include non-transitory (tangible) computer readable storage media that stores the software code). The software code may sometimes be referred to as program instructions, software, data, instructions, or code. Software code stored on storage circuitry 16 may be executed by processing circuitry 18.

Control circuitry 14 may be used to run software on device 10 such as satellite navigation applications, internet browsing applications, voice-over-internet-protocol (VOIP) telephone call applications, email applications, media playback applications, operating system functions, etc. To support interactions with external equipment, control circuitry 14 may be used in implementing communications protocols. Communications protocols that may be implemented using control circuitry 14 include internet protocols, wireless local area network (WLAN) protocols (e.g., IEEE 802.11 protocols—sometimes referred to as Wi-Fi®), protocols for other short-range wireless communications links such as the Bluetooth® protocol or other wireless personal area network (WPAN) protocols, IEEE 802.11 ad protocols (e.g., ultra-wideband protocols), cellular telephone protocols (e.g., 3G protocols, 4G (LTE) protocols, 5G protocols, etc.), antenna diversity protocols, satellite navigation system protocols (e.g., global positioning system (GPS) protocols, global navigation satellite system (GLONASS) protocols, etc.), antenna-based spatial ranging protocols (e.g., radio detection and ranging (RADAR) protocols or other desired range detection protocols for signals conveyed at millimeter and centimeter wave frequencies), or any other desired communications protocols. Each communications protocol may be associated with a corresponding radio access technology (RAT) that specifies the physical connection methodology used in implementing the protocol.

Device 10 may include input-output circuitry 20. Input-output circuitry 20 may include input-output devices 22. Input-output devices 22 may be used to allow data to be supplied to device 10 and to allow data to be provided from device 10 to external devices. Input-output devices 22 may include user interface devices, data port devices, and other input-output components. For example, input-output devices 22 may include touch sensors, displays (e.g., touch-sensitive and/or force-sensitive displays), light-emitting components such as displays without touch sensor capabilities, buttons (mechanical, capacitive, optical, etc.), scrolling wheels, touch pads, key pads, keyboards, microphones, cameras, buttons, speakers, status indicators, audio jacks and other audio port components, digital data port devices, motion sensors (accelerometers, gyroscopes, and/or compasses that detect motion), capacitance sensors, proximity sensors, magnetic sensors, force sensors (e.g., force sensors coupled to a display to detect pressure applied to the display), etc. In some configurations, keyboards, headphones, displays, pointing devices such as trackpads, mice, and joysticks, and other input-output devices may be coupled to device 10 using wired or wireless connections (e.g., some of input-output devices 22 may be peripherals that are coupled to a main processing unit or other portion of device 10 via a wired or wireless link).

Input-output circuitry 20 may include wireless circuitry 24 to support wireless communications. Wireless circuitry 24 (sometimes referred to herein as wireless communications circuitry 24) may include one or more antennas. Wireless circuitry 24 may also include baseband processor circuitry, transceiver circuitry, amplifier circuitry, filter circuitry, switching circuitry, radio-frequency transmission lines, and/or any other circuitry for transmitting and/or receiving radio-frequency signals using the antenna(s).

Wireless circuitry 24 may transmit and/or receive radio-frequency signals within a corresponding frequency band at radio frequencies (sometimes referred to herein as a communications band or simply as a "band"). The frequency bands handled by wireless circuitry 24 may include wireless local area network (WLAN) frequency bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network (WPAN) frequency bands such as the 2.4 GHz Bluetooth® band or other WPAN communications bands, cellular telephone frequency bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), other centimeter or millimeter wave frequency bands between 10-300 GHz, near-field communications frequency bands (e.g., at 13.56 MHz), satellite navigation frequency bands (e.g., a GPS band from 1565 to 1610 MHz, a Global Navigation Satellite System (GLONASS) band, a BeiDou Navigation Satellite System (BDS) band, etc.), ultra-wideband (UWB) frequency bands that operate under the IEEE 802.15.4 protocol and/or other ultra-wideband communications protocols, communications bands under the family of 3GPP wireless communications standards, communications bands under the IEEE 802.XX family of standards, and/or any other desired frequency bands of interest.

Figure 2:
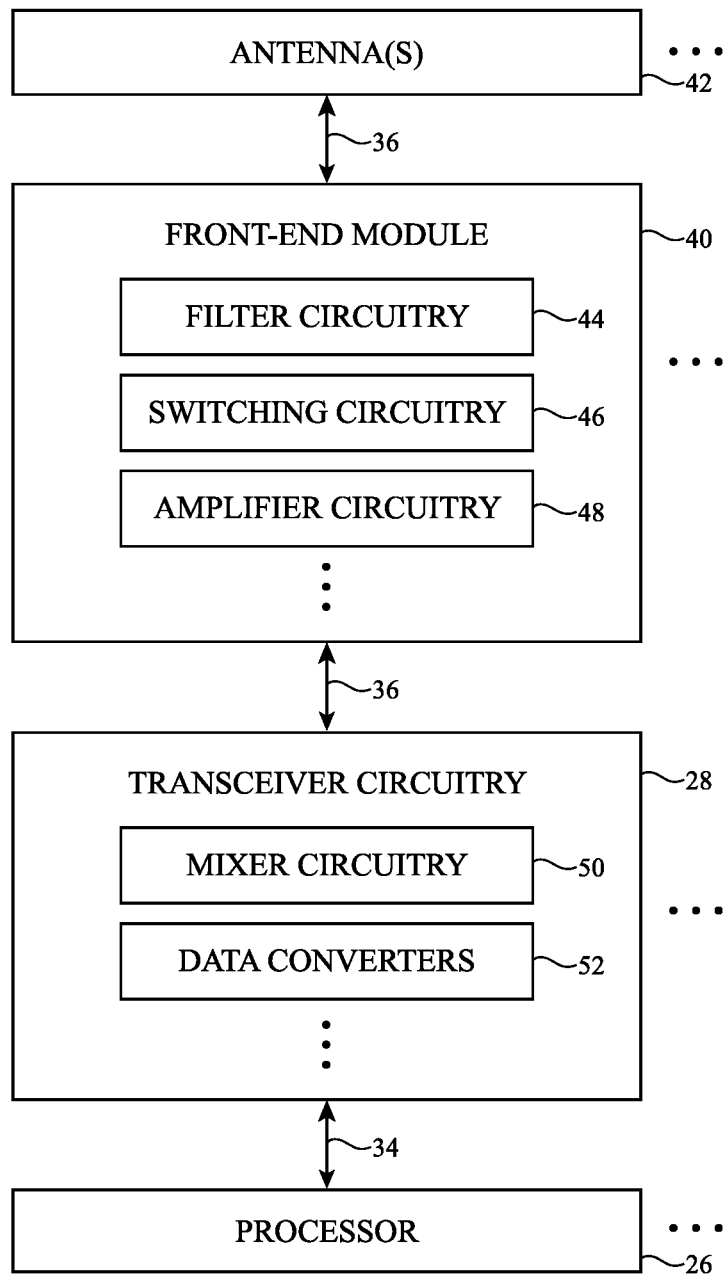
FIG. 2 is a diagram of illustrative wireless circuitry having transceiver circuitry in accordance with some embodiments.

FIG. 2 is a diagram showing illustrative components within wireless circuitry 24. As shown in FIG. 2, wireless circuitry 24 may include one or more processors such as processor(s) 26, radio-frequency (RF) transceiver circuitry such as radio-frequency transceiver 28, radio-frequency front end circuitry such as radio-frequency front end module (FEM) 40, and antenna(s) 42. Processor 26 may be a baseband processor, an application processor, a digital signal processor, a microcontroller, a microprocessor, a central processing unit (CPU), a programmable device, a combination of these circuits, and/or one or more processors within circuitry 18. Processor 26 may be configured to generate digital (transmit or baseband) signals. Processor 26 may be coupled to transceiver 28 over path 34 (sometimes referred to as a baseband path). Transceiver 28 may be coupled to antenna 42 via radio-frequency transmission line path 36. Radio-frequency front end module 40 may be disposed on radio-frequency transmission line path 36 between transceiver 28 and antenna 42.

Wireless circuitry 24 may include one or more antennas such as antenna 42. Antenna 42 may be formed using any desired antenna structures. For example, antenna 42 may be an antenna with a resonating element that is formed from loop antenna structures, patch antenna structures, inverted-F antenna structures, slot antenna structures, planar inverted-F antenna structures, helical antenna structures, monopole antennas, dipoles, hybrids of these designs, etc. Two or more antennas 42 may be arranged into one or more phased antenna arrays (e.g., for conveying radio-frequency signals at millimeter wave frequencies). Parasitic elements may be included in antenna 42 to adjust antenna performance. Antenna 42 may be provided with a conductive cavity that backs the antenna resonating element of antenna 42 (e.g., antenna 42 may be a cavity-backed antenna such as a cavity-backed slot antenna).

In the example of FIG. 2, wireless circuitry 24 is illustrated as including only a single processor 26, a single transceiver 28, a single front end module 40, and a single antenna 42 for the sake of clarity. In general, wireless circuitry 24 may include any desired number of processors 26, any desired number of transceivers 36, any desired number of front end modules 40, and any desired number of antennas 42. Each processor 26 may be coupled to one or more transceiver 28 over respective paths 34. Each transceiver 28 may include a transmitter circuit configured to output uplink signals to antenna 42, may include a receiver circuit configured to receive downlink signals from antenna 42, and may be coupled to one or more antennas 42 over respective radio-frequency transmission line paths 36. Each radio-frequency transmission line path 36 may have a respective front end module 40 disposed thereon. If desired, two or more front end modules 40 may be disposed on the same radio-frequency transmission line path 36. If desired, one or more of the radio-frequency transmission line paths 36 in wireless circuitry 24 may be implemented without any front end module disposed thereon.

Front end module (FEM) 40 may include radio-frequency front end circuitry that operates on the radio-frequency signals conveyed (transmitted and/or received) over radio-frequency transmission line path 36. Front end module may, for example, include front end module (FEM) components such as radio-frequency filter circuitry 44 (e.g., low pass filters, high pass filters, notch filters, band pass filters, multiplexing circuitry, duplexer circuitry, diplexer circuitry, triplexer circuitry, etc.), switching circuitry 46 (e.g., one or more radio-frequency switches), radio-frequency amplifier circuitry 48 (e.g., one or more power amplifiers and one or more low-noise amplifiers), impedance matching circuitry (e.g., circuitry that helps to match the impedance of antenna 42 to the impedance of radio-frequency transmission line 36), antenna tuning circuitry (e.g., networks of capacitors, resistors, inductors, and/or switches that adjust the frequency response of antenna 42), radio-frequency coupler circuitry, charge pump circuitry, power management circuitry, digital control and interface circuitry, and/or any other desired circuitry that operates on the radio-frequency signals transmitted and/or received by antenna 42. Each of the front end module components may be mounted to a common (shared) substrate such as a rigid printed circuit board substrate or flexible printed circuit substrate. If desired, the various front end module components may also be integrated into a single integrated circuit chip.

Filter circuitry 44, switching circuitry 46, amplifier circuitry 48, and other circuitry may be disposed on radio-frequency transmission line path 36, may be incorporated into FEM 40, and/or may be incorporated into antenna 42 (e.g., to support antenna tuning, to support operation in desired frequency bands, etc.). These components, sometimes referred to herein as antenna tuning components, may be adjusted (e.g., using control circuitry 14) to adjust the frequency response and wireless performance of antenna 42 over time.

Radio-frequency transmission line path 36 may be coupled to an antenna feed on antenna 42. The antenna feed may, for example, include a positive antenna feed terminal and a ground antenna feed terminal. Radio-frequency transmission line path 36 may have a positive transmission line signal path such that is coupled to the positive antenna feed terminal on antenna 42. Radio-frequency transmission line path 36 may have a ground transmission line signal path that is coupled to the ground antenna feed terminal on antenna 42. This example is illustrative and, in general, antennas 42 may be fed using any desired antenna feeding scheme. If desired, antenna 42 may have multiple antenna feeds that are coupled to one or more radio-frequency transmission line paths 36.

Radio-frequency transmission line path 36 may include transmission lines that are used to route radio-frequency antenna signals within device 10 (FIG. 1). Transmission lines in device 10 may include coaxial cables, microstrip transmission lines, stripline transmission lines, edge-coupled microstrip transmission lines, edge-coupled stripline transmission lines, transmission lines formed from combinations of transmission lines of these types, etc. Transmission lines in device 10 such as transmission lines in radio-frequency transmission line path 36 may be integrated into rigid and/or flexible printed circuit boards. In one suitable arrangement, radio-frequency transmission line paths such as radio-frequency transmission line path 36 may also include transmission line conductors integrated within multilayer laminated structures (e.g., layers of a conductive material such as copper and a dielectric material such as a resin that are laminated together without intervening adhesive). The multilayer laminated structures may, if desired, be folded or bent in multiple dimensions (e.g., two or three dimensions) and may maintain a bent or folded shape after bending (e.g., the multilayer laminated structures may be folded into a particular three-dimensional shape to route around other device components and may be rigid enough to hold its shape after folding without being held in place by stiffeners or other structures). All of the multiple layers of the laminated structures may be batch laminated together (e.g., in a single pressing process) without adhesive (e.g., as opposed to performing multiple pressing processes to laminate multiple layers together with adhesive).

Transceiver circuitry 28 may include wireless local area network transceiver circuitry that handles WLAN communications bands (e.g., Wi-Fi® (IEEE 802.11) or other WLAN communications bands) such as a 2.4 GHz WLAN band (e.g., from 2400 to 2480 MHz), a 5 GHz WLAN band (e.g., from 5180 to 5825 MHz), a Wi-Fi® 6E band (e.g., from 5925-7125 MHz), and/or other Wi-Fi® bands (e.g., from 1875-5160 MHz), wireless personal area network transceiver circuitry that handles the 2.4 GHz Bluetooth® band or other WPAN communications bands, cellular telephone transceiver circuitry that handles cellular telephone bands (e.g., bands from about 600 MHz to about 5 GHz, 3G bands, 4G LTE bands, 5G New Radio Frequency Range 1 (FR1) bands below 10 GHz, 5G New Radio Frequency Range 2 (FR2) bands between 20 and 60 GHz, etc.), near-field communications (NFC) transceiver circuitry that handles near-field communications bands (e.g., at 13.56 MHz), satellite navigation receiver circuitry that handles satellite navigation bands (e.g., a GPS band from 1565 to 1610 MHz, a Global Navigation Satellite System (GLONASS) band, a BeiDou Navigation Satellite System (BDS) band, etc.), ultra-wideband (UWB) transceiver circuitry that handles communications using the IEEE 802.15.4 protocol and/or other ultra-wideband communications protocols, and/or any other desired radio-frequency transceiver circuitry for covering any other desired communications bands of interest.

In performing wireless transmission, processor 26 may provide digital signals to transceiver 28 over path 34. Transceiver 28 may further include circuitry for converting the baseband signals received from processor 26 into corresponding intermediate frequency or radio-frequency signals. Transceiver circuitry 28 may also include data converters 52, which can include digital-to-analog converter (DAC) and/or analog-to-digital converter (ADC) circuitry for converting signals between digital and analog domains. For example, transceiver circuitry 28 may include a DAC circuit for converting digital signals to corresponding analog signals and mixer circuitry 50 for up-converting (or modulating) the baseband signals to intermediate frequencies or radio frequencies prior to transmission over antenna 42. Transceiver 28 may include a transmitter component to transmit the radio-frequency signals over antenna 42 via radio-frequency transmission line path 36 and front end module 40. Antenna 42 may transmit the radio-frequency signals to external wireless equipment by radiating the radio-frequency signals into free space.

In performing wireless reception, antenna 42 may receive radio-frequency signals from the external wireless equipment. The received radio-frequency signals may be conveyed to transceiver 28 via radio-frequency transmission line path 36 and front end module 40. Transceiver 28 may include circuitry for converting the received radio-frequency signals into corresponding intermediate frequency or baseband signals. For example, transceiver 28 may use mixer circuitry 50 for down-converting (or demodulating) the received radio-frequency signals to baseband frequencies and may use an ADC circuit for converting analog signals to corresponding digital signals prior to conveying the received signals to processor 26 over path 34.

Figure 3:
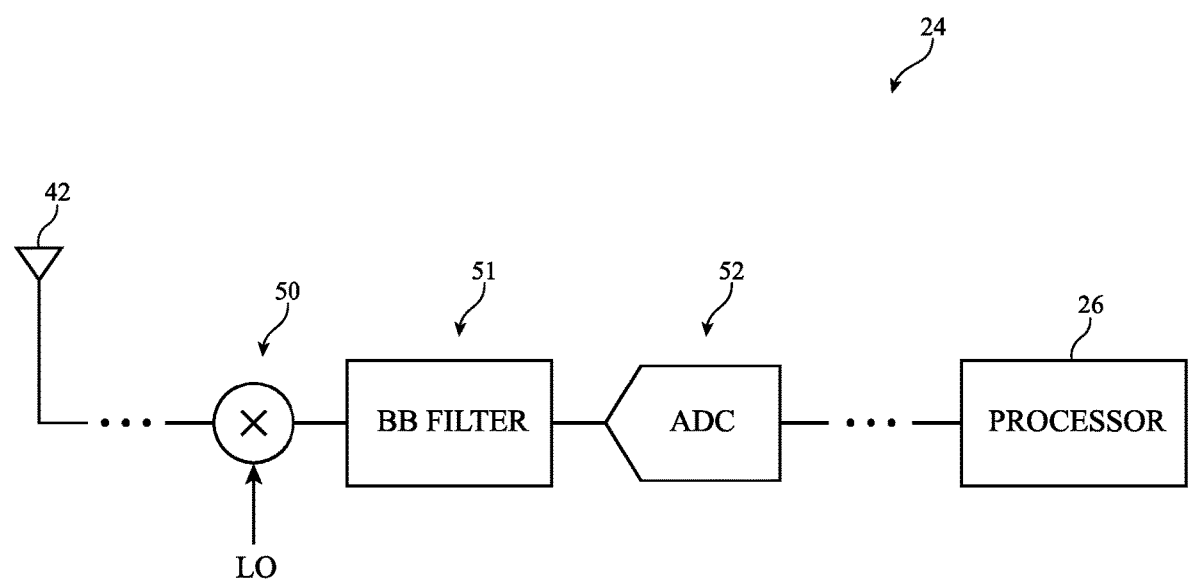
FIG. 3 is a diagram of illustrative wireless circuitry having an analog-to-digital converter in accordance with some embodiments.

FIG. 3 is a diagram of illustrative wireless circuitry 24 showing a filter 51 and an analog-to-digital converter (ADC) 52 coupled between a mixer 50 and processor 26. One or more circuit components (e.g., circuits within front-end module 40 shown in FIG. 2 or other radio-frequency components) may be disposed between antenna 42 and mixer 50. Mixer 50 may have a first input that receives radio-frequency signals from antenna 42, a second input that receives a local oscillator signal LO, and an output on which down-converted intermediate frequency (IF) or baseband signals are generated. Baseband filter 51 may, for example, include an amplifier such as a transimpedance amplifier (TIA) and an RC filter configured to provide out-of-band rejection. An RC filter can be defined as a filter circuit having a series resistor and a shunt capacitor. One or more circuit components may be disposed between ADC circuit 52 and processor 26.

Figure 4:
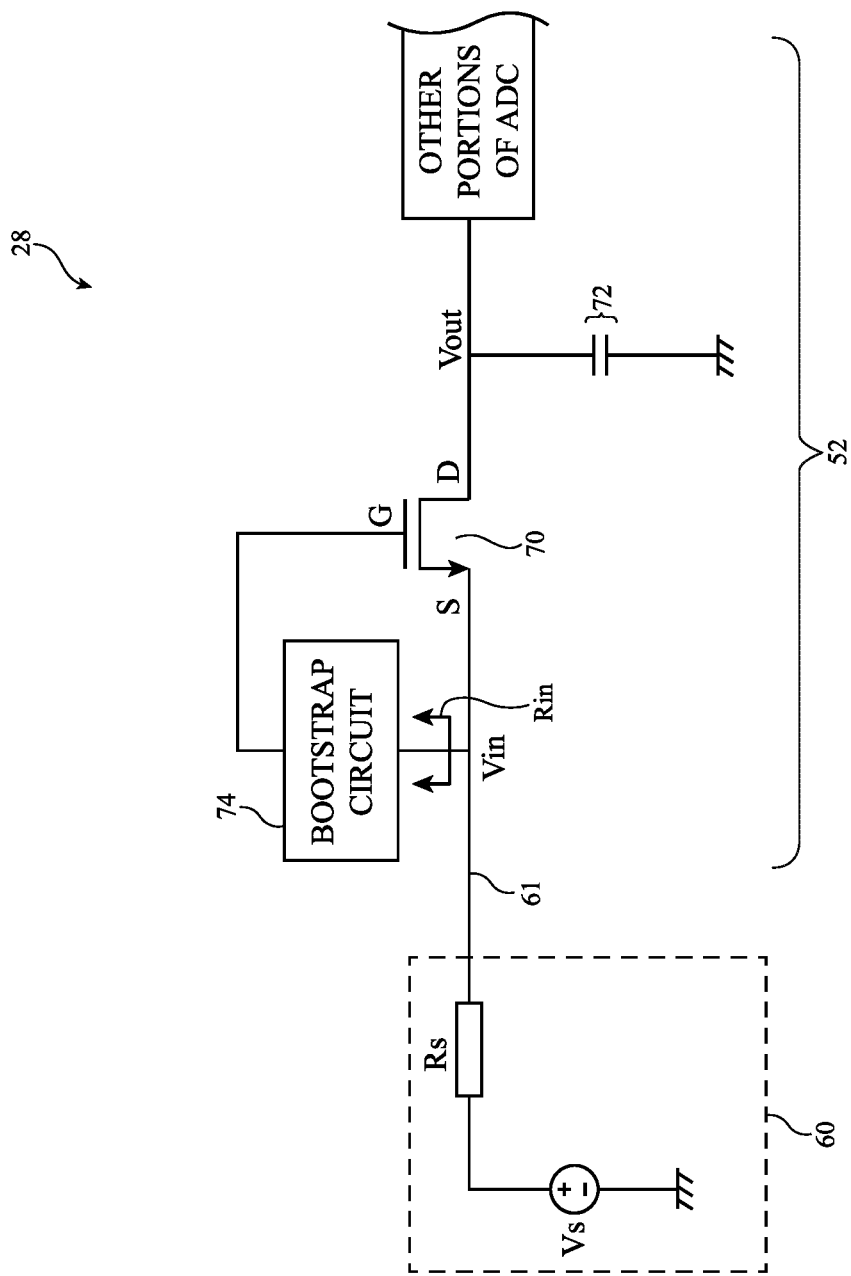
FIG. 4 is a diagram of illustrative transceiver circuitry having a filter and an analog-to-digital converter (ADC) with an input sampling switch and a bootstrap circuit coupled to the input sampling switch in accordance with some embodiments.

FIG. 4 illustrates additional circuit components that can be coupled at the input of ADC circuit 52 (sometimes referred to as ADC circuitry). As shown in FIG. 4, ADC circuitry 52 may include a sampling switch such as sampling switch 70 coupled at the input of ADC circuitry 52. Sampling switch 70 may be a metal-oxide-semiconductor (MOS) transistor such as an n-channel MOS (NMOS) transistor. As another example, sampling switch 70 can be a p-channel MOS (PMOS) transistor. In general, sampling switch 70 may be implemented using any type of switching component. Device configurations in which sampling switch 70 is an n-channel (n-type) metal-oxide-semiconductor is sometimes described herein as an example. Sampling switch 70 that is coupled at the input of ADC circuitry 52 is sometimes referred to as an ADC input sampling switch or transistor. ADC circuitry 52 may generally represent any type of ADC circuit (e.g., a flash ADC, a successive-approximation-register ADC, a single-slope ADC, a dual-slope ADC, a pipelined ADC, a sigma delta ADC, or other types of ADC circuit).

ADC input sampling transistor 70 may have a drain (D) terminal coupled to other portions of ADC circuitry 52 (e.g., to remaining circuit components within ADC circuitry 52), a source (S) terminal configured to receive an input voltage signal Vin, and a gate (G) terminal configured to receive a control voltage for transistor 70. Input voltage Vin may have a DC (direct current) voltage level Vdc, sometimes referred to as a common mode voltage Vcm in a differential ADC architecture. Voltage that is sampled by transistor 70 can be passed through from its source (input) terminal to its drain (output) terminal as output voltage Vout that is provided to the remaining components within ADC circuitry 52. Voltage Vout is therefore sometimes referred to as a sampled voltage. Capacitance 72 may represent an input capacitance associated with ADC circuit 52. The terms "source" and "drain" are sometimes used interchangeably when referring to current-conducting terminals of a metal-oxide-semiconductor transistor. The source and drain terminals are therefore sometimes referred to as "source-drain" terminals (e.g., a transistor has a gate terminal, a first source-drain terminal, and a second source-drain terminal).

In the example of FIG. 4, a circuit such as circuit 60 may be coupled to the source (input) terminal of ADC input sampling switch 70 at node 61. Circuit 60 may generally represent any circuit preceding ADC circuitry 52 and can be represented by a source voltage Vs and a source resistance Rs. Circuit 60 can represent baseband filter 51 of FIG. 3 (e.g., a transimpedance amplifier followed by a passive filter such as an RC filter), an active filter (e.g., a filter circuit having a transistor or other actively powered components), an anti-aliasing filter, a bandpass filter, a band-stop filter, other types of filters, a buffer circuit, or other electrical components. Source voltage Vs may have a direct current (DC) portion and a small signal alternating current (AC) portion. The DC portion of Vs may set Vdc at the input of sampling switch (at node 61). The DC voltage portion Vdc may be set equal to half of the ADC power supply (e.g., Vadc/2, where Vadc represents the positive supply voltage power the ADC circuitry 52) or may be set to other voltage levels. By setting Vdc equal to half the ADC power supply voltage level, the signal swing of the AC small signals appearing at node 61 can be maximized.

In accordance with some embodiments, a bootstrapping circuit such as bootstrap circuit 74 may be coupled to ADC input sampling switch 70. For example, bootstrap circuit 74 may have a first (input) terminal coupled to the source (input) terminal of switch 70 and a second (output) terminal coupled to the gate (control) terminal of switch 70. A "bootstrap circuit" can be defined as a circuit that is used to maintain a constant voltage across input sampling switch 70 (e.g., to maintain a constant or stable voltage Vgs across the gate and source terminals of switch 70 for different levels of input voltage Vin). If care is not taken, voltage Vdc at the input of sampling switch 70 can be even lower than the DC portion of Vs. The low Vdc (Vcm) can limit the ADC input swing range. Ideally, Vdc should be set equal to half the ADC supply voltage (i.e., Vadc/2) for maximum input swing, but if Vdc is reduced, the input swing range is reduced accordingly. This can be exacerbated when source resistance Rs is high, which can cause further voltage division at filter output 61 and thus resulting in more voltage reduction of Vdc than desired.

The amount of reduction in Vdc may be dependent on the input impedance of bootstrap circuit 74 and the source resistance of circuit 60. As shown in FIG. 4, bootstrap circuit 74 may have an input impedance (e.g., an input resistance Rin) when looking into the first terminal of bootstrap circuit 74 from the perspective of the input port of sampling switch 70. The presence of both Rs and Rin will cause a voltage divider at node 61, so the voltage at node 61 will be effectively equal to Vs*(Rin/(Rin+Rs)). Thus, even when Rin is 10*Rs, the Vdc at the input of sampling switch 70 will be reduced by around 9%. In other words, a low input resistance Rin of bootstrap circuit 74 can cause further reduction in Vdc, whereas a high input resistance Rin of bootstrap circuit 74 will help maintain Vdc at a higher voltage level (e.g., at Vadc/2) and thus maximizing the input signal swing at the input of sampling switch 70. It may therefore be desirable to increase or boost the input impedance/resistance of bootstrap circuit 74.

Figure 5:
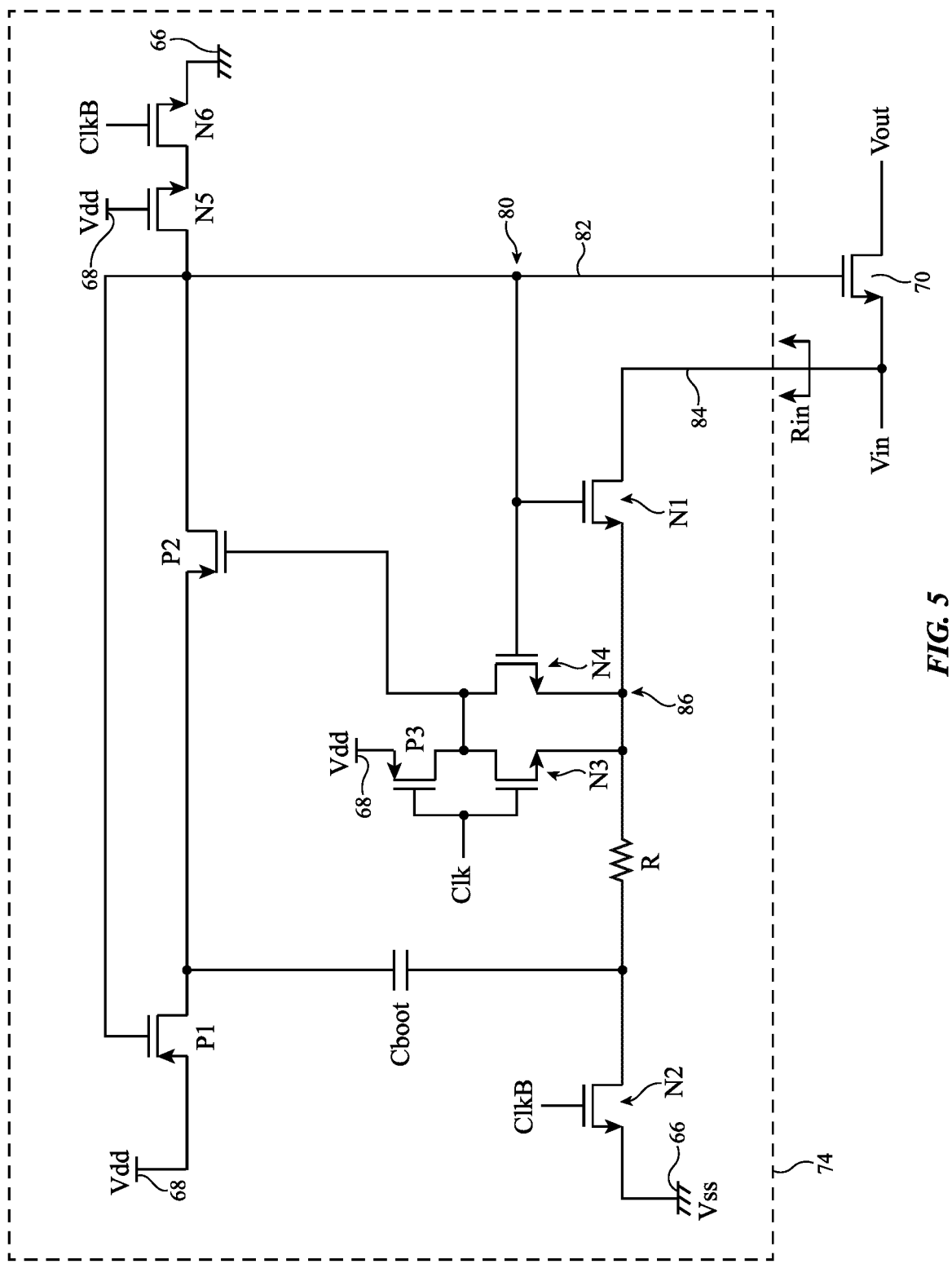
FIG. 5 is a circuit diagram of an illustrative bootstrap circuit having a series input resistor in accordance with some embodiments.

FIG. 5 is a circuit diagram of an illustrative bootstrap circuit 74. As shown in FIG. 5, bootstrap circuit may include a capacitor such as bootstrap capacitor Cboot and switches N1-N6 and P1-P3. Switches N1-N6 may be n-channel (n-type) transistors, whereas switches P1-P3 may be p-channel (p-type) transistors. Transistor N1 may have a first source-drain terminal coupled to the source (input) terminal of sampling switch 70 via path 84, a second source-drain terminal coupled to internal node 86, and a gate terminal coupled to an output node 80 of bootstrap circuit 74. Path 84 may receive input voltage Vin and is therefore sometimes referred to as an input port of bootstrap circuit 74. Output node 80 may be coupled to the gate terminal of sampling switch 70 via path 82 (sometimes referred to as an output port of bootstrap circuit 74). In other words, bootstrap circuit 74 may have an input port (or input) that is coupled to the source (input) terminal of switch 70 and an output port (or output) that is coupled to the gate (control) terminal of switch 70.

Transistor N2 may have a first source-drain terminal (e.g., a drain terminal) that is coupled to the second source-drain terminal of transistor N1 (e.g., coupled to node 86), a gate terminal configured to receive an inverted clock signal ClkB, and a second source-drain terminal (e.g., a source terminal) that is coupled to ground line 66 (e.g., a ground power supply terminal on which ground voltage Vss is provided). Bootstrap capacitor Cboot has a first terminal that is coupled to the first source-drain terminal of transistor N2 and a second terminal. The first terminal of Cboot is sometimes referred to as a "bottom plate" terminal (since this particular terminal is discharged to ground power supply voltage Vss during a hold phase), whereas the second terminal of Cboot is sometimes referred to as a "top plate" terminal (since this particular terminal is charged up to positive power supply voltage Vdd during the hold phase). The terms top and bottom can be interchangeable.

Transistor P1 may have a first source-drain terminal (e.g., a source terminal) that is coupled to positive power supply line 68 (e.g., a positive power supply terminal on which positive power supply voltage Vdd is provided), a second source-drain terminal (e.g., a drain terminal) that is coupled to the second terminal of capacitor Cboot, and a gate terminal that is coupled to the output port of bootstrap circuit 74 (to output node 80). Transistor P2 may have a first source-drain terminal that is coupled to the second terminal of capacitor Cboot, a second source-drain terminal that is coupled to the output port of bootstrap circuit 74 (to output node 80), and a gate terminal. Positive power supply voltage Vdd can be equal to the ADC power supply voltage Vadc or can be different.

Transistor N3 may have a source terminal coupled to the second source-drain terminal of transistor N1 (e.g., coupled to node 86), a gate terminal configured to receive clock signal Clk, and a drain terminal that is coupled to the gate terminal of transistor P2. Clock signal ClkB may be an inverted version of clock signal Clk (e.g., clock signals Clk and ClkB may be phase shifted by 180 degrees). Transistor P3 may have a drain terminal coupled to the drain terminal of transistor N3, a gate terminal also configured to receive clock signal Clk, and a source terminal coupled to positive power supply line 68. Transistors N3 and P3 arranged in this way are sometimes referred to collectively as an inverter or an inverting circuit. Transistor N4 may have a first source-drain terminal (e.g., a source terminal) that is coupled to node 86, a gate terminal coupled to the gate terminal of transistor N1, and a second source-drain terminal (e.g., a drain terminal) that is coupled to the drain terminal of transistor N3 and also to the gate terminal of transistor P2.

Transistor N5 may have a drain terminal coupled to node 80, a gate terminal configured to receive positive power supply voltage Vdd, and a source terminal. Transistor N6 may have a drain terminal coupled to the source terminal of transistor N5, a gate terminal configured to receive inverted clock signal ClkB, and a source terminal coupled to ground line 66 (e.g., a power supply line on which a ground power supply voltage Vss is provided). Ground line 66 is sometimes referred to as a ground power supply line or ground.

Bootstrap circuit 74 may be operable in a hold phase and a track (tracking) phase (e.g., bootstrap circuit 74 may alternate between a track phase and a hold phase). Clock signal Clk may be pulsed low during the hold phase, so inverted clock signal ClkB will be pulsed high during the hold phase. Since clock signal ClkB is high (asserted) during the hold phase, transistor N2 will be turned on (activated) to drive the first terminal of capacitor Cboot to ground voltage Vss. Since clock signal Clk is low during the hold phase, transistor P3 will be turned on to drive the output of the inverter high to Vdd, which turns off (deactivates) transistor P2. Since clock signal ClkB is high during the hold phase, transistor N6 will also be turned on, which drives output node 80 down to ground voltage Vss. A low voltage at the output port of bootstrap capacitor 94 will turn on transistor P1, which will charge the second terminal of capacitor Cboot to Vdd. A low voltage at the output port of bootstrap circuit 74 will turn off transistors N1 and N4 and will also turn off (deactivate) the ADC input sampling switch 70. Thus, during the hold phase (period), positive power supply voltage Vdd can be driven onto and stored across the terminals of capacitor Cboot (e.g., the bootstrap capacitor can be charged to Vdd).

During the track phase (tracking period), clock signal Clk may be pulsed high while inverted clock signal ClkB is pulsed low. Since signal ClkB is pulsed low (deasserted) during the track phase, transistors N2 and N6 will be turned off. During the track phase, transistor N1 may be turned on, which passes input voltage Vin to internal node 86. Transistor N4 will also be turned on, which also passes input voltage Vin to the gate terminal of transistor P2. Capacitor Cboot does not have a discharge path during the track phase, so it must maintain the previously stored Vdd across its two terminals. As a result, since node 86 is driven to voltage level Vin, bootstrap capacitor Cboot will force its second terminal to be at (Vin+Vdd). This boosted voltage level (Vin+Vdd) may be pass to node 80 to the output port of bootstrap circuit 74, which also helps to overdrive ADC sampling switch 70. Operated in this way, a constant voltage difference Vdd can be maintained across the gate and source terminals of sampling switch 70.

The input resistance Rin of bootstrap circuit 74 may generally be inversely related to the frequency of clock signal Clk and inversely related to the capacitance value of bootstrap capacitor Cboot. Thus, a way to increase the input resistance Rin of bootstrap circuit 74 might be to reduce the clock frequency and/or to reduce the capacitance value of Cboot (e.g., to make Cboot smaller). The clock rate of signals Clk and ClkB is typically dictated by the operating frequency of the ADC circuit and thus cannot be easily reduced. On the other hand, making capacitor Cboot smaller can cause the Vgs of sampling switch 70 to be less than the desired Vdd level due to charge distribution with the parasitic capacitance associated with the various transistors that are turned on during the tracking period (e.g., some of the charge stored on Cboot might leak to the parasitic capacitance associated with transistors N1, N3, and N4). Such type of charge redistribution effect from Cboot to the parasitic capacitance is only noticeable when downsizing the value of Cboot.

To avoid having to reduce the clock frequency or the size of the bootstrap capacitor, bootstrap circuit 74 may include a resistor R coupled between transistor N1 and capacitor Cboot. In particular, resistor R may have a first terminal coupled to the second source-drain terminal of transistor N1 (node 86) and a second terminal coupled to the first terminal of bootstrap capacitor Cboot and to the drain terminal of transistor N2. Resistor R is sometimes referred to as a series input resistance or generally a resistive component. Configured in this way, the input resistance Rin of bootstrap circuit 74 can be expressed as follows:

$$Rin = \frac{1}{fclk * Cboot} * \frac{1 - e^{\left(\frac{-t}{R * Cboot}\right)}}{1 - e^{\left(\frac{-D}{fclk * R * Cboot}\right)}} \quad (1)$$

where fclk represents the frequency of signal Clk and ClkB, where D represents the duty cycle of the clock signals, where Cboot represents the capacitance of the bootstrap capacitor, and where R represents the real resistance value of the series resistor R. Thus, to increase input resistance Rin without changing fclk and Cboot, the resistance of resistor R can be increased and/or duty cycle D can be reduced.

The use of the specific n-type and p-type transistors shown in FIG. 5 is exemplary and is not intended to limit the scope of the present embodiments. If desired, the polarity of each transistor within circuit 74 can be swapped (e.g., n-channel transistors can be changed to p-type transistors and vice versa) without altering the intended function of bootstrap circuit 74. If desired, bootstrap circuit 74 may include additional transistors and/or other passive components or some of the transistors shown in FIG. 5 can be omitted.

Figure 6:
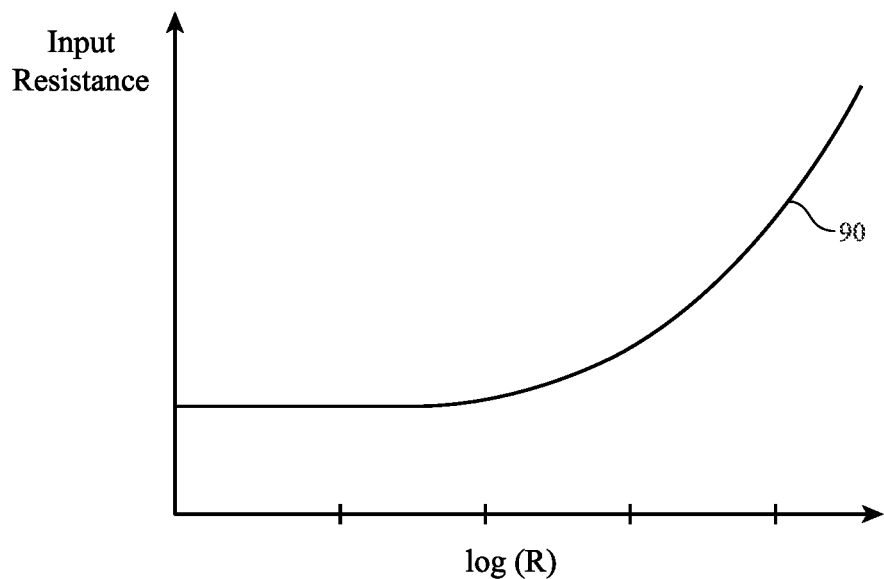
FIG. 6 is a plot showing how a bootstrap circuit of the type shown in FIG. 5 can have an input resistance that is a function of the resistance value of the series input resistor in accordance with some embodiments.

FIG. 6 is a plot showing how the input resistance Rin of bootstrap circuit 74 can vary as a function of the value of resistor R. As shown by curve 90 in FIG. 7, the overall input resistance of bootstrap circuit 74 does not increase linearly with the value of resistor R. The initial effective Rin value is only defined by fclk and Cboot assuming a resistance of 0 Ω. As the value of resistor R gets higher than the initial effective Rin, the overall input resistance Rin of circuit 74 can increase by an amount or factor that is more than the incremental change in the value of R. For example, assuming an fclk of 20 MHz (Megahertz), a Cboot of 1 pF (picofarad), a 50% duty cycle, and an R of 10 kΩ, the effective switched capacitor resistance can be calculated to be equal to 101 kΩ. Increasing the resistance of R from 10 kΩ(kiloohms) to 100 kΩ(e.g., a 90 kΩ increase) might boost the effective input resistance Rin by more than 90 kΩ because the effective input resistance Rin can be calculated to be 258 kΩ. As another example, increasing the resistance of R from 100 kΩ to 1 MΩ(e.g., a 900 kΩ increase) might boost the effective input resistance Rin by more than 900 kΩ and an effective input resistance Rin of 2.09 MΩ can be obtained. The extra improvement in Rin that can be achieved in this way using series resistor R is unexpected and not obvious. As examples, resistor R can have a resistance value equal to 1 kΩ or more, 10 kΩ or more, 50 kΩ or more, 10-100 kΩ, 100 kΩ or more, 500 kΩ or more, 100 kΩ to 1 MΩ, more than 1 MΩ, or more than 10 MΩ.

Figure 7:
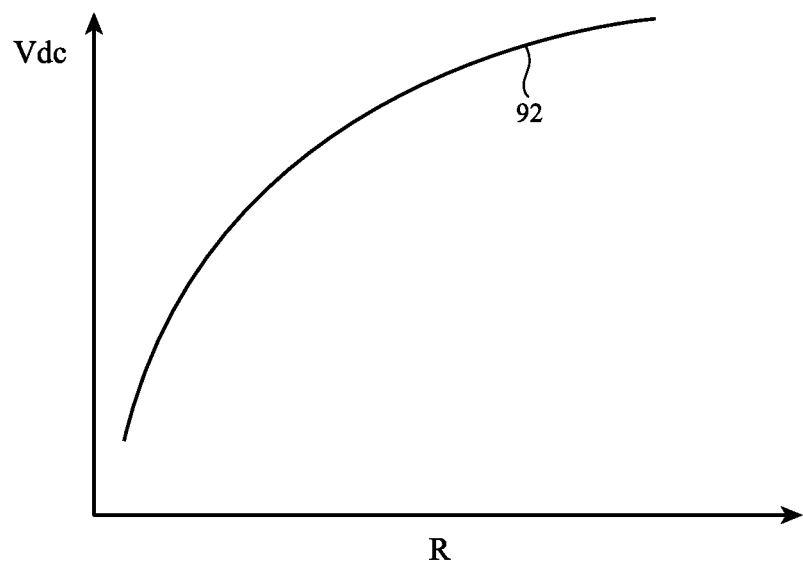
FIG. 7 is a plot showing how a DC voltage level at the input sampling switch can vary as a function of the resistance value of the series input resistor in the bootstrap circuit in accordance with some embodiments.

FIG. 7 is a plot showing how DC voltage level Vdc at the input of sampling switch 70 can vary as a function of the value of resistor R. As shown by curve 92, the DC voltage Vdc (sometimes referred to as the input common mode voltage for differential systems) may ramp up as the value of resistor R increases. In the ideal scenario, Vdc is equal to the source voltage Vs. With low Rin values, however, the source might not be able to drive Rin and a signal loss can occur due to the voltage division between Rs and Rin. The addition of resistor R (and the use of larger values of R) can thus help increase the Vdc voltage level at the input of sampling switch 70. Increasing Vdc can help prevent potential degradation of signal swing across the gate and source terminals of the input sampling switch 70.

Figure 8:
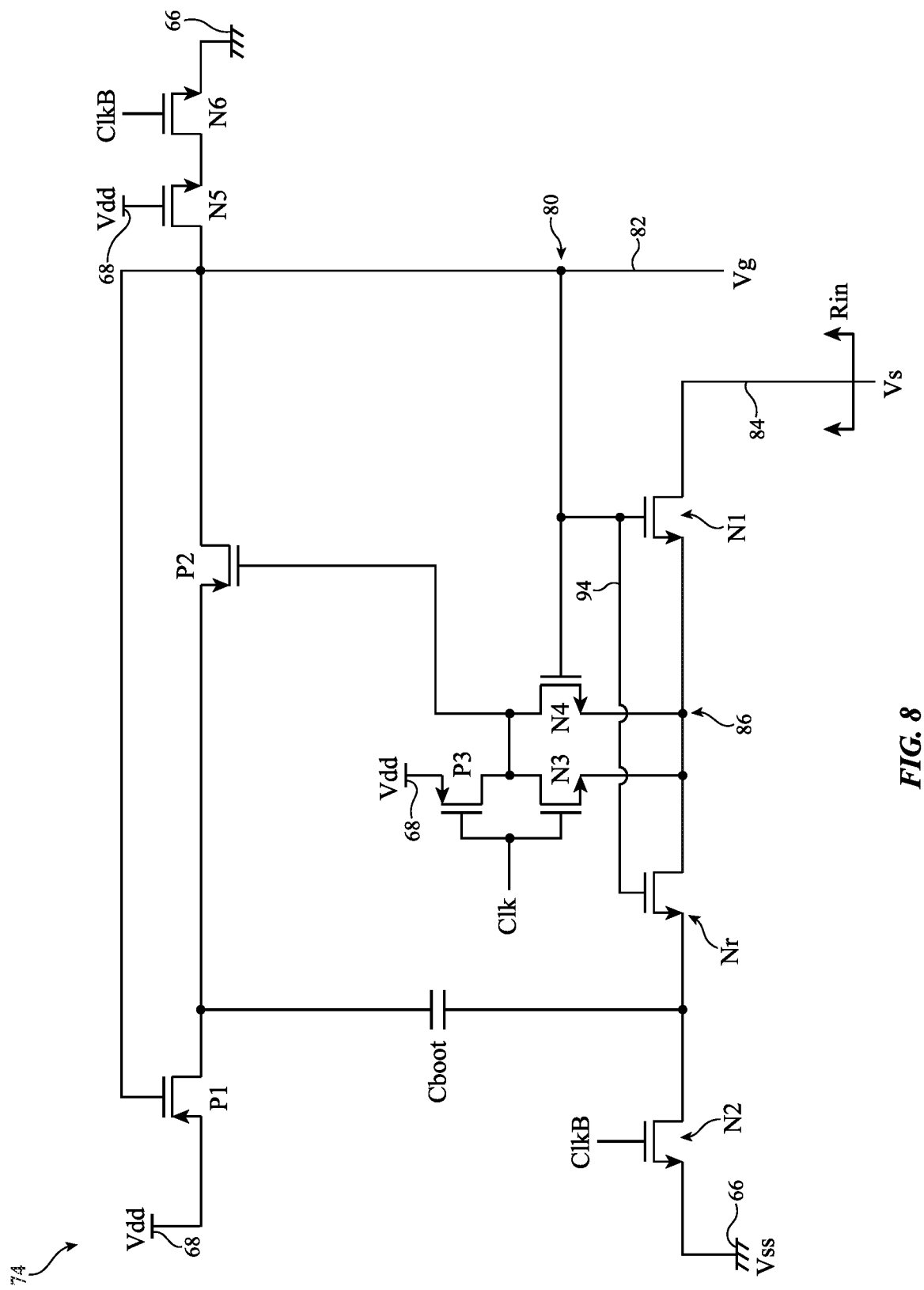
FIG. 8 is a circuit diagram of an illustrative bootstrap circuit having a series input switch configured to increase the input impedance of the bootstrap circuit in accordance with some embodiments.

Bootstrap circuit 74 having resistor R coupled between transistors N1 and N2 as shown in FIG. 5 is exemplary and not intended to limit the scope of the present embodiments. FIG. 8 shows bootstrap circuit 74 having a switch such as a transistor Nr coupled between transistors N1 and N2. As shown in FIG. 8, transistor Nr can have a first source-drain terminal coupled to the second source-drain terminal of transistor N1, a gate terminal that is shorted to the gate terminal of transistor N1 (e.g., that is connected to output node 80), and a second source-drain terminal that is coupled to the first terminal of bootstrap capacitor Cboot and to the drain terminal of transistor N2. Configured in this way, transistor (switch) Nr can serve as a resistance during the track phase and can be turned off (deactivated) during the hold phase. The remainder of bootstrap circuit 74 of FIG. 8 has the same structure and function as that already described in connection with FIG. 5 and need not be reiterated in detail to avoid obscuring the present embodiment.

Figure 9:
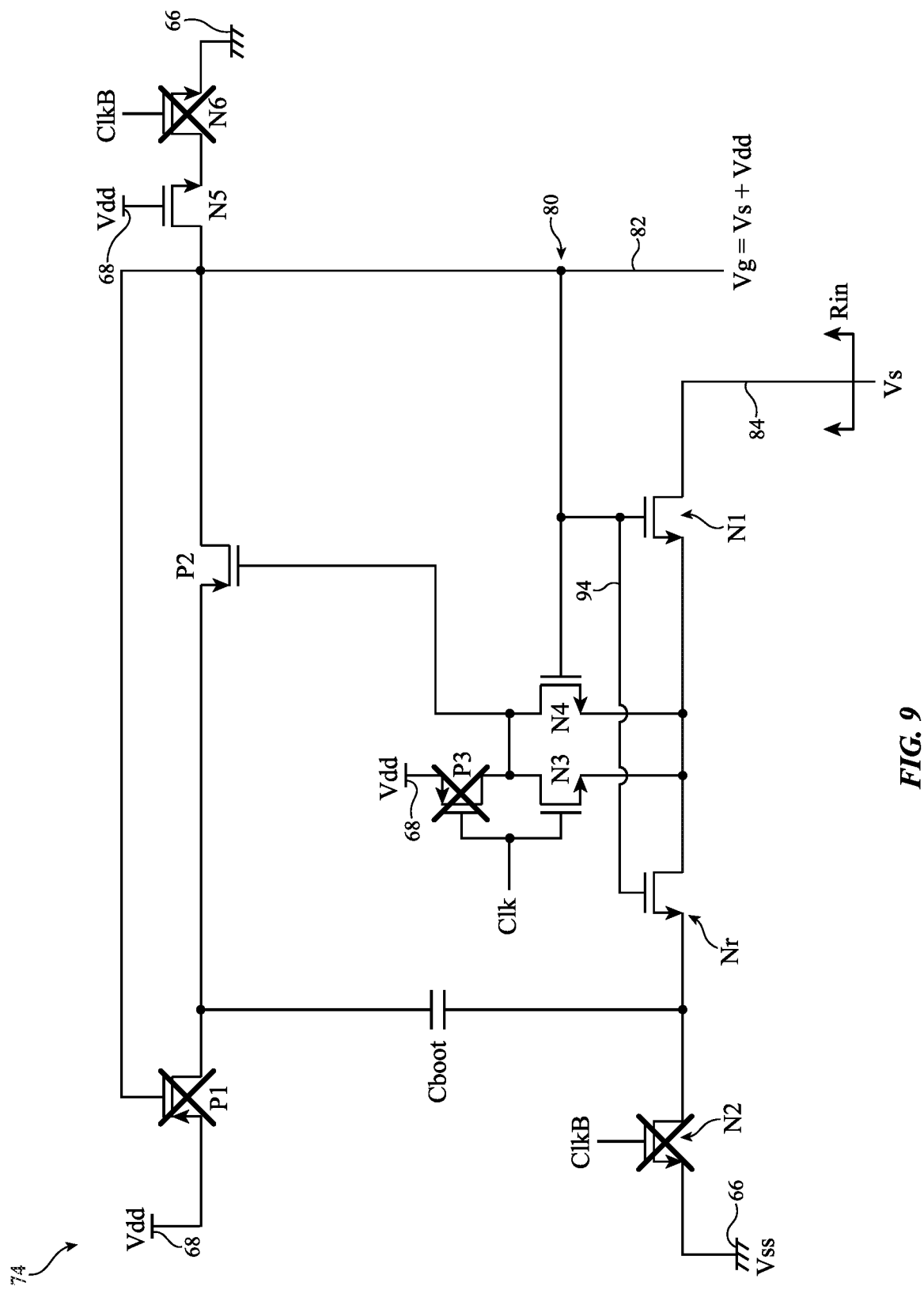
FIG. 9 is a diagram showing the bootstrap circuit of FIG. 8 operating in a tracking phase in accordance with some embodiments.
Figure 10:
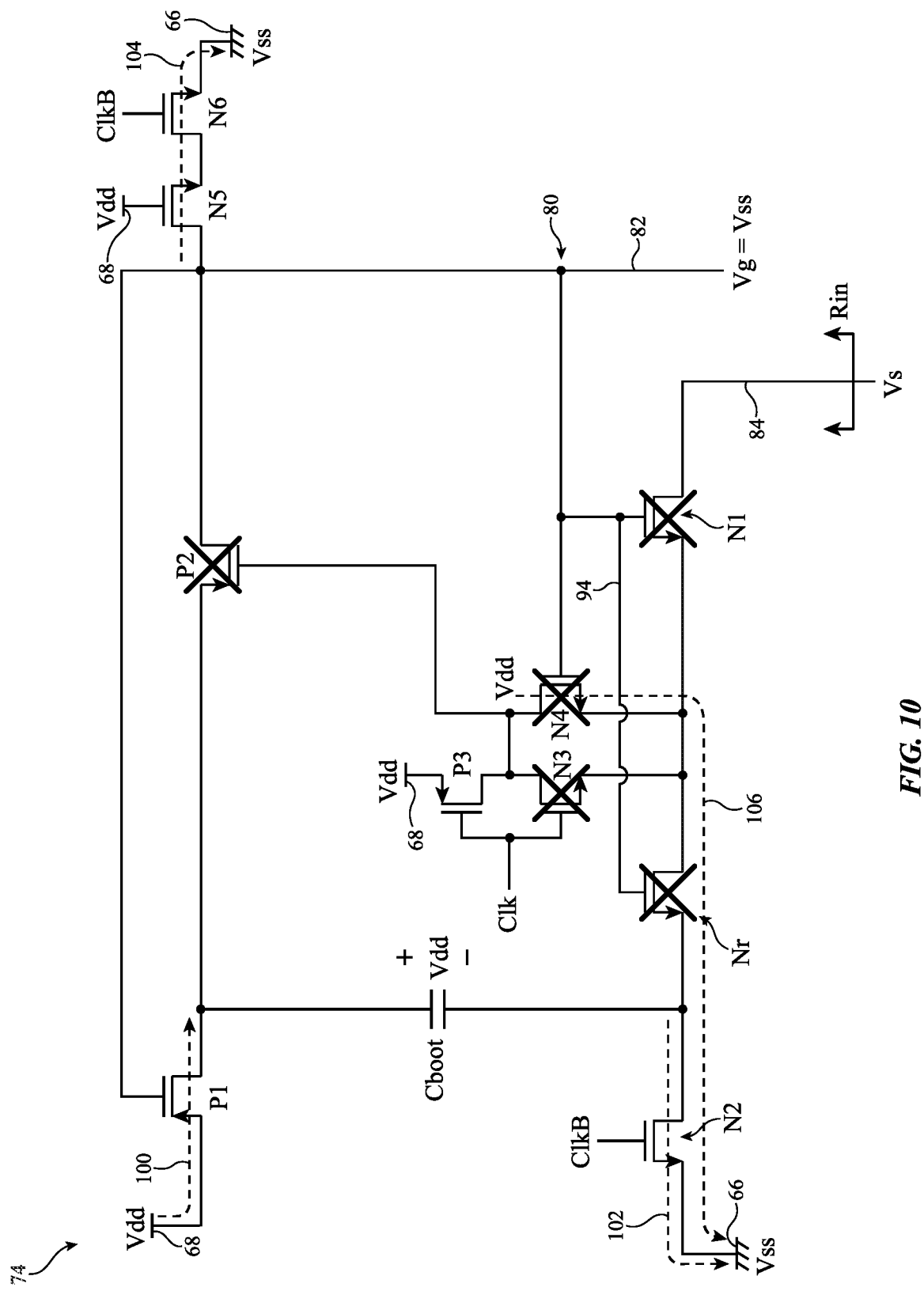
FIG. 10 is a diagram showing the bootstrap circuit of FIG. 8 operating in a hold phase in accordance with some embodiments.

Operation of bootstrap circuit 74 of FIG. 8 may alternate between a hold phase (period) and a track phase (period). FIG. 9 shows bootstrap circuit 74 of FIG. 8 operating in the track phase. During the track phase (tracking period), clock signal Clk may be pulsed high while inverted clock signal ClkB is pulsed low. Since signal ClkB is pulsed low during the track phase, transistors N2 and N6 will be turned off During the track phase, transistors N1 and Nr may be turned on, which passes input voltage Vin to the first terminal of capacitor Cboot. Transistor N4 will also be turned on, which also passes input voltage Vin to the gate terminal of transistor P2. Capacitor Cboot does not have a discharge path during the track phase, so it must maintain a stored Vdd across its two terminals (e.g., capacitor Cboot can be charged to Vdd during the hold phase, as shown in FIG. 10). As a result, the first terminal of capacitor Cboot is driven to voltage level Vin, bootstrap capacitor Cboot will force its second terminal to be at (Vin+Vdd). This boosted voltage level (Vin+Vdd) may be pass to node 80 to the output port of bootstrap circuit 74, which also helps to overdrive ADC sampling switch 70. Operated in this way, a constant voltage difference Vdd can be maintained across the gate and source terminals of sampling switch 70.

Thus, during the track phase, transistor Nr can act like a resistive component. Transistor Nr can be sized relatively small to increase its effective resistance during the tracking phase. For example, transistor Nr can have a minimum size allowed by the current fabrication technology node, can have a longer gate length than the minimum gate length allowed by the current fabrication technology, can be a low mobility device, can be fabricated to have a higher threshold voltage level, or configured in other ways to increase its effective resistance when switched on. As examples, transistor Nr can have a resistance value (when switched on) that is equal to 1 kΩ or more, 10 kΩ or more, 50 kΩ or more, 10-100 kΩ, 100 kΩ or more, 500 kΩ or more, 100 kΩ to 1 MΩ, more than 1 MΩ, or more than 10 MΩ to help increase the overall input resistance of bootstrap circuit 74. Transistor Nr can therefore be referred to as a resistive component. The embodiment of FIG. 5 in which a resistor R is coupled in series between node 86 and the bottom plate terminal of Cboot and the embodiment of FIG. 8 in which a transistor Nr is coupled in series between node 86 and the bottom plate terminal of Cboot are exemplary. In general, any one or more resistive element(s) or component(s) can be disposed between node 86 and Cboot to help increase the input resistance (impedance) of bootstrap circuit 74.

FIG. 10 shows bootstrap circuit 74 of FIG. 8 operating in the hold phase. Clock signal Clk may be pulsed low during the hold phase, so inverted clock signal ClkB will be pulsed high during the hold phase. Since clock signal ClkB is high during the hold phase, transistor N2 will be turned on (activated) to drive the first terminal of capacitor Cboot to ground voltage Vss (as illustrated by current path 102). Since clock signal Clk is low during the hold phase, transistor P3 will be turned on to drive the output of the inverter high to Vdd, which turns off (deactivates) transistor P2. Since clock signal ClkB is high during the hold phase, transistor N6 will also be turned on, which drives output node 80 down to ground voltage Vss (as shown by current path 104). A low voltage at the output port of bootstrap capacitor 94 will turn on transistor P1, which will charge the second terminal of capacitor Cboot to Vdd (as shown by charging path 100). A low voltage at the output port of bootstrap circuit 74 will turn off transistors N1 and N4 and will also turn off (deactivate) the ADC input sampling switch 70. Thus, during the hold phase (period), positive power supply voltage Vdd can be driven onto and stored across the terminals of capacitor Cboot (e.g., the bootstrap capacitor can be charged to Vdd).

Unlike the tracking period during which transistor Nr serves as a resistive circuit for increasing the effective input resistance of bootstrap circuit 24, transistor Nr is turned off during the holding period. Turning off transistor Nr can help block any potential DC leakage path flowing through transistor N4 (see potential leakage current path 106) and/or block potential DC leakage path flowing through transistor N3, which can help preserve the Vdd stored across capacitor Cboot. Furthermore, turning off transistor Nr can help decouple capacitor Cboot from any potentially large parasitic capacitance associated with transistors N1, N3, and N4, which can provide a faster charging time for capacitor Cboot since transistor N2 will no longer need to discharge the additional parasitic capacitance associated with transistors N1, N3, and N4. Configured and operated in this way, bootstrap circuit 74 can help ensure high levels of Vdc at the input of sampling switch 70 without having to reduce the capacitance of Cboot and can help minimize signal distortion by maintaining a high signal swing across the gate the source terminals of sampling switch 70 without comprising on the performance (speed) of the overall ADC circuitry.

The methods and operations described above in connection with FIGS. 1-10 may be performed by the components of device 10 using software, firmware, and/or hardware (e.g., dedicated circuitry or hardware). Software code for performing these operations may be stored on non-transitory computer readable storage media (e.g., tangible computer readable storage media) stored on one or more of the components of device 10 (e.g., storage circuitry 16 and/or wireless communications circuitry 24 of FIG. 1). The software code may sometimes be referred to as software, data, instructions, program instructions, or code. The non-transitory computer readable storage media may include drives, non-volatile memory such as non-volatile random-access memory (NVRAM), removable flash drives or other removable media, other types of random-access memory, etc. Software stored on the non-transitory computer readable storage media may be executed by processing circuitry on one or more of the components of device 10 (e.g., processing circuitry in wireless circuitry 24, processing circuitry 18 of FIG. 1, etc.). The processing circuitry may include microprocessors, application processors, digital signal processors, central processing units (CPUs), application-specific integrated circuits with processing circuitry, or other processing circuitry.

The foregoing is illustrative and various modifications can be made to the described embodiments. The foregoing embodiments may be implemented individually or in any combination.

What is claimed is:

1. A bootstrap circuit comprising:
   a capacitor;
   a first transistor having a first source-drain terminal coupled to an input port of the bootstrap circuit, a gate terminal coupled to an output port of the bootstrap circuit, and a second source-drain terminal coupled to a terminal of the capacitor;
   a second transistor having a first source-drain terminal coupled to the terminal of the capacitor and having a second source-drain terminal coupled to a ground power supply line; and
   a resistive component coupled between the second source-drain terminal of the first transistor and the terminal of the capacitor.

2. The bootstrap circuit of claim 1, wherein the resistive component comprises a transistor having a first source-drain terminal coupled to the second source-drain terminal of the first transistor, a second source-drain terminal coupled to the terminal of the capacitor, and a gate terminal coupled to the gate terminal of the first transistor.

3. The bootstrap circuit of claim 2, wherein the resistive component is turned on during a first phase of operation and is turned off during a second phase of operation and wherein the bootstrap circuit alternates between the first and second phases of operation.

4. The bootstrap circuit of claim 2, wherein the first transistor comprises a transistor of a given channel type and wherein the resistive component comprises a transistor of the given channel type.

5. The bootstrap circuit of claim 2, wherein the first transistor and the resistive component comprise n-channel transistors.

6. The bootstrap circuit of claim 1, wherein the resistive component comprises a resistor having a first terminal coupled to the second source-drain terminal of the first transistor and having a second terminal coupled to the terminal of the capacitor.

7. The bootstrap circuit of claim 6, wherein the resistor has a resistance value of at least one kiloohms.

8. The bootstrap circuit of claim 1, wherein the second transistor has a gate terminal configured to receive a clock signal.

9. The bootstrap circuit of claim 1, further comprising:
   an inverter coupled to a node between the first transistor and the resistive component and configured to receive a first clock signal, wherein the second transistor has a gate terminal configured to receive a second clock signal that is inverted with respect to the first clock signal.

10. The bootstrap circuit of claim 1, further comprising:
    a third transistor having a source terminal coupled to the second source-drain terminal of the first transistor, a gate terminal configured to receive a clock signal, and a drain terminal;
    a fourth transistor having a source terminal coupled to the second source-drain terminal of the first transistor, a gate terminal shorted to the gate terminal of the first transistor, and a drain terminal coupled to the drain terminal of the third transistor;
    a fifth transistor having a drain terminal coupled to the drain terminal of the third transistor, a gate terminal configured to receive the clock signal, and a source terminal coupled to a positive power supply line;
    a sixth transistor having a source terminal coupled to the positive power supply line, a drain terminal coupled to another terminal of the capacitor, and a gate terminal coupled to the output port of the bootstrap circuit; and
    a seventh transistor having a first source-drain terminal coupled to the drain terminal of the sixth transistor, a second source-drain terminal coupled to the output port of the bootstrap circuit, and a gate terminal coupled to a node between the third and fifth transistors.

11. Circuitry comprising:
    a sampling switch configured to receive an input voltage;
    a capacitor;
    a first transistor having a first source-drain terminal configured to receive the input voltage, a gate terminal coupled to a control terminal of the sampling switch, and a second source-drain terminal coupled to a terminal of the capacitor;

a second transistor having a first source-drain terminal coupled to the terminal of the capacitor and having a second source-drain terminal coupled to ground; and a resistive component coupled between the second source-drain terminal of the first transistor and the terminal of the capacitor.

12. The circuitry of claim 11, wherein the resistive component comprises a transistor having a first source-drain terminal coupled to the second source-drain terminal of the first transistor, a second source-drain terminal coupled to the terminal of the capacitor, and a gate terminal coupled to the control terminal of the sampling switch.

13. The circuitry of claim 12, wherein the second transistor has a gate terminal configured to receive a clock signal, wherein the second transistor is configured to discharge the terminal of the capacitor when the clock signal is asserted, and wherein the resistive component is turned off while the second transistor is used to discharge the terminal of the capacitor.

14. The circuitry of claim 11, wherein the resistive component comprises a resistor having a first terminal coupled to the second source-drain terminal of the first transistor and having a second terminal coupled to the terminal of the capacitor.

15. The bootstrap circuit of claim 14, wherein the resistor has a resistance value of more than one kiloohms.

16. Analog-to-digital converter circuitry comprising:
a sampling switch having an input configured to receive an input voltage, an output coupled to other portions of the analog-to-digital converter circuitry, and a control terminal; and
a bootstrap circuit having
a capacitor,
a first transistor having a first source-drain terminal coupled to the input of the sampling switch, a gate terminal coupled to the control terminal of the sampling switch, and a second source-drain terminal coupled to a terminal of the capacitor, and
a resistive component coupled between the second source-drain terminal of the first transistor and the terminal of the capacitor.

17. The analog-to-digital converter circuitry of claim 16, further comprising a filter having an output coupled to the input of the sampling switch.

18. The analog-to-digital converter circuitry of claim 17, wherein the filter comprises an RC filter.

19. The analog-to-digital converter circuitry of claim 16, wherein the bootstrap circuit further comprises:
a second transistor having a first source-drain terminal coupled to the terminal of the capacitor, a second source-drain terminal coupled to a power supply line, and a gate terminal configured to receive a clock signal.

20. The analog-to-digital converter circuitry of claim 16, wherein the resistive component comprises a resistor or a transistor.

* * * * *